United States Patent
Nagashima et al.

[11] Patent Number: 6,166,320
[45] Date of Patent: Dec. 26, 2000

[54] TANDEM SOLAR CELL

[75] Inventors: Tomonori Nagashima, Susono; Takeshi Nishikawa, Shizuoka-ken, both of Japan

[73] Assignee: Toyota Jidosha Kabushiki Kaisha, Japan

[21] Appl. No.: 09/442,410

[22] Filed: Nov. 18, 1999

Related U.S. Application Data

[63] Continuation of application No. PCT/JP99/00463, Feb. 4, 1999.

[30] Foreign Application Priority Data

| Mar. 19, 1998 | [JP] | Japan | 10-070976 |
| May 7, 1998 | [JP] | Japan | 10-124778 |
| Dec. 25, 1998 | [JP] | Japan | 10-368767 |

[51] Int. Cl.[7] .......... H01L 31/04; H01L 31/078
[52] U.S. Cl. .......... 136/249; 136/252; 136/255; 136/256; 257/438; 257/440; 257/459; 257/463; 257/461; 257/431
[58] Field of Search .......... 136/249 TJ, 249 MS, 136/252, 255, 256; 257/438, 440, 459, 463, 461, 431

[56] References Cited

U.S. PATENT DOCUMENTS

| 3,990,101 | 11/1976 | Ettenberg et al. | 136/249 |
| 4,295,002 | 10/1981 | Chappell et al. | 136/255 |
| 4,479,027 | 10/1984 | Todorof | 136/249 |
| 5,103,851 | 4/1992 | Nishida et al. | 136/249 |

FOREIGN PATENT DOCUMENTS

| 51-113481 | 10/1976 | Japan . |
| 63-222469 | 9/1988 | Japan . |
| 1-225372 | 9/1989 | Japan . |
| 4226084 | 8/1992 | Japan . |
| WO 99/48157 | 9/1999 | WIPO . |

*Primary Examiner*—Alan Diamond
*Attorney, Agent, or Firm*—Finnegan, Henderson, Farabow, Garrett & Dunner, L.L.P.

[57] ABSTRACT

A solar cell that is capable of having a thickness optimum for the highest photoelectric conversion efficiency and achieves reduction of carrier recombination loss is provided. For this purpose, a solar cell (10) is formed by stacking a top cell (12) including an $n^+$ layer, a p layer, and a $p^+$ layer, and a bottom cell (14) including an $n^+$ layer and a $p^+$ layer arranged at the bottom of the p layer along the back surface. The top cell (12) has a band gap wider than that of the bottom cell (14). A top electrode (18) is formed at the $n^+$ layer of the top cell (12), while a negative electrode (26) and a positive electrode (28) are individually connected to the $n^+$ layer and the $p^+$ layer of the bottom cell (14), respectively. These negative and positive electrodes (26, 28) serve as a pair of electrodes of the bottom cell (14) and the positive electrode (28) is also used as the other electrode of the top cell (12), forming a pair with the top electrode (18) which is one electrode of the top cell (12). As a result, the minority carriers generated in the top and bottom cells (12, 14) can be individually obtained from the electrodes of the respective cells where they are generated.

9 Claims, 12 Drawing Sheets

PRIOR ART

Fig. 16

PRIOR ART

TANDEM SOLAR CELL

This application is a continuation of International Application No. PCT/JP99/00463, filed Feb. 4, 1999, the content of which is incorporated herein by reference.

TECHNICAL FIELD

The present invention relates to a solar cell, and more particularly to an improved tandem solar cell comprising stacked unit solar cells with different band gaps.

BACKGROUND ART

Tandem solar cells comprising stacked unit solar cells with different band gaps are known as devices for providing improved photoelectric conversion efficiency by utilizing its wide wavelength range. An example of such a tandem solar cell is disclosed in Japanese Patent Laid-Open Publication No. Hei 4-226084.

Figure 15:
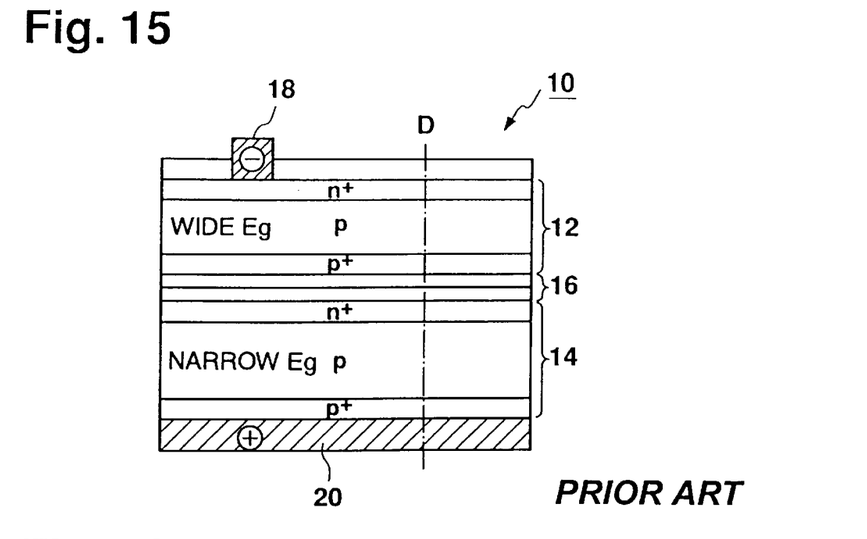
FIG. 15 is a cross sectional view showing a structure of a conventional tandem solar cell.

FIG. 15 is a cross sectional view showing a conventional tandem solar cell. Referring to FIG. 15, a solar cell 10 includes a top cell 12 which is a unit solar cell provided on the light incident side (top of the figure), a bottom cell 14 which is a unit solar cell provided on the back side, and a tunnel diode 16 provided between these cells. The solar cell also includes a top electrode 18 disposed on the light incident side, and a bottom electrode 20 on the back side. Generally, in such a tandem solar cell, a solar cell with a wide band gap (Eg) is used for the top cell, while a solar cell with a narrow band gap is used for the bottom cell.

Figure 16:
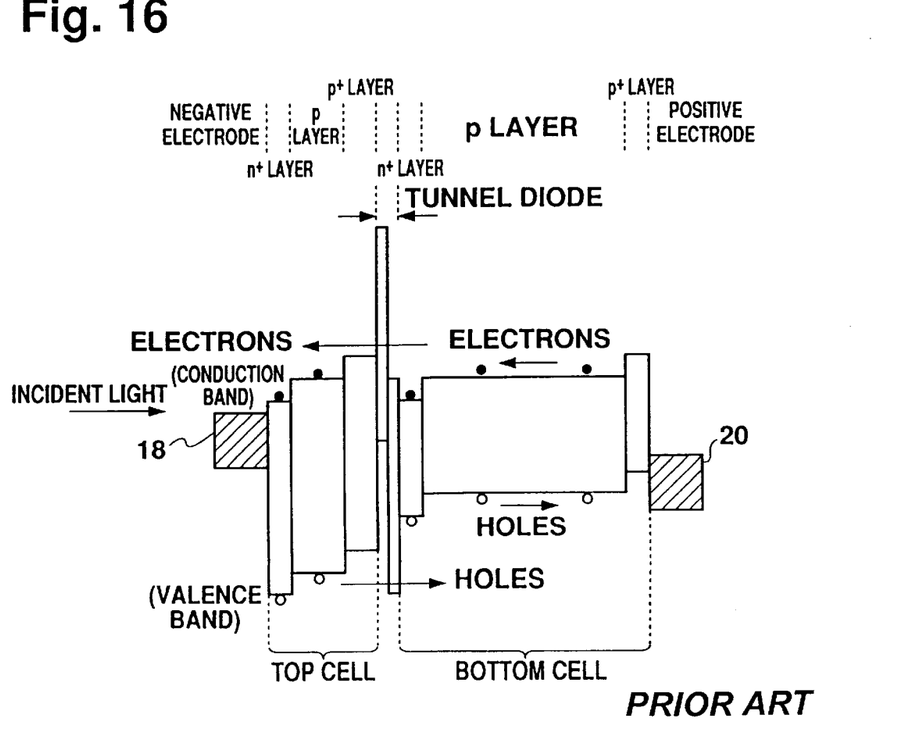
FIG. 16 shows a band structure of the tandem solar cell shown in FIG. 15.

FIG. 16 shows a band structure of the solar cell taken along the broken line D in FIG. 15. As shown in FIG. 16, carriers, i.e. electrons and holes, cannot be transported through the junction between the top and bottom cells 12 and 14 because of the difference between the band levels of the cells 12 and 14. Therefore, the tunnel diode 16 is provided at the junction for permitting movement of carriers at this junction, so that the top cell 12 and the bottom cell 14 are connected in series to function as an integrated solar cell. Because the top and bottom cells 12 and 14 can absorb light with different wavelengths from each other, the above-described structure can absorb light with a wider range of wavelengths, to thereby enhance photoelectric conversion efficiency.

In the conventional solar cell 10 in FIG. 15, however, the currents flowing through the top and bottom cells 12 and 14 must be equal to each other because the cells 12 and 14 are connected in series. Therefore, the top and bottom cells 12 and 14 of the solar cell 10 shown in FIG. 15 must have a thickness such that the same amount of carriers are generated in these cells and the same amount of currents flow therethrough. As a result, it is not possible to provide the cells with an optimum thickness for high photoelectric conversion efficiency.

Further, considerable resistance loss and carrier recombination loss are observed in the tunnel diode 16 provided between the top and bottom cells 12 and 14.

In addition, the solar cell suffers from a high defect density due to lattice mismatch at the interface between the top and bottom cells 12 and 14, leading to lose of minority carriers due to recombination at this portion.

The present invention has been conceived in view of the above problems, and aims to provide a solar cell having a thickness most advantageous for a high photoelectric conversion efficiency and capable of reducing carrier recombination loss.

DISCLOSURE OF THE INVENTION

In order to achieve the above object, the present invention provides a tandem solar cell formed by stacking unit solar cells with different band gaps, comprising a top electrode provided at a light incident surface of the solar cell and serving as one electrode of the unit solar cell on the light incident side, and back electrodes provided at a back surface of the solar cell and individually connected to an n layer and a p layer formed on the back side to serve as the other electrode of the unit solar cell on the light incident side and as a pair of electrodes of the unit solar cell on the back side.

In the above solar cell, a multi-quantum well layer may be formed between the unit solar cells with different band gaps.

The present invention also provides a tandem solar cell formed by stacking unit solar cells with different band gaps, comprising a top electrode provided at a light incident surface of the solar cell and serving as one electrode of the unit solar cell on the light incident side, and back electrodes provided at a back surface of the solar cell and individually connected to an n layer and a p layer formed on the back side to serve as the other electrode of the unit solar cell on the light incident side and as a pair of electrodes of the unit solar cell on the back side, wherein, among the unit solar cells with different band gaps, the unit solar cell on the back side includes a diffusion layer having a higher impurity concentration than a substrate and provided at an uppermost surface thereof.

The impurity concentration of the diffusion layer in the above solar cell may be set at $10$–$10^6$ times that of the substrate.

The present invention also provides a tandem solar cell formed by stacking unit solar cells with different band gaps, comprising a top electrode provided at a light incident surface of the solar cell and serving as one electrode of the unit solar cell on the light incident side, and back electrodes provided at a back surface of the solar cell and individually connected to an n layer and a p layer formed on the back side to serve as the other electrode of the unit solar cell on the light incident side and as a pair of electrodes of the unit solar cell on the back side, wherein, among the unit solar cells with different band gaps, the unit solar cell on the back side includes an insulating layer provided at an uppermost surface thereof so as to form an opening at the surface.

In the above solar cell, the total area of the opening may be preferably set to 0.01–10% of the overall surface area.

In the above solar cell, the total area of the opening may be also preferably set to 0.1–2% of the overall surface area.

The present invention provides a tandem solar cell formed by stacking unit solar cells with different band gaps, comprising a top electrode provided at a light incident surface of the solar cell and serving as one electrode of the unit solar cell on the light incident side, and back electrodes provided at a back surface of the solar cell and individually connected to an n layer and a p layer formed on the back side to serve as the other electrode of the unit solar cell on the light incident side and as a pair of electrodes of the unit solar cell on the back side, wherein an intermediate layer containing hydrogen or halogen is provided between the unit solar cells with different band gaps.

In the above solar cell, the concentration of hydrogen or halogen is 1 ppm–30% by weight, based on the weight of the intermediate layer.

BEST MODE FOR CARRYING OUT THE INVENTION

Preferred embodiments of the present invention will next be described with reference to the drawings.

First Embodiment

Figure 1:
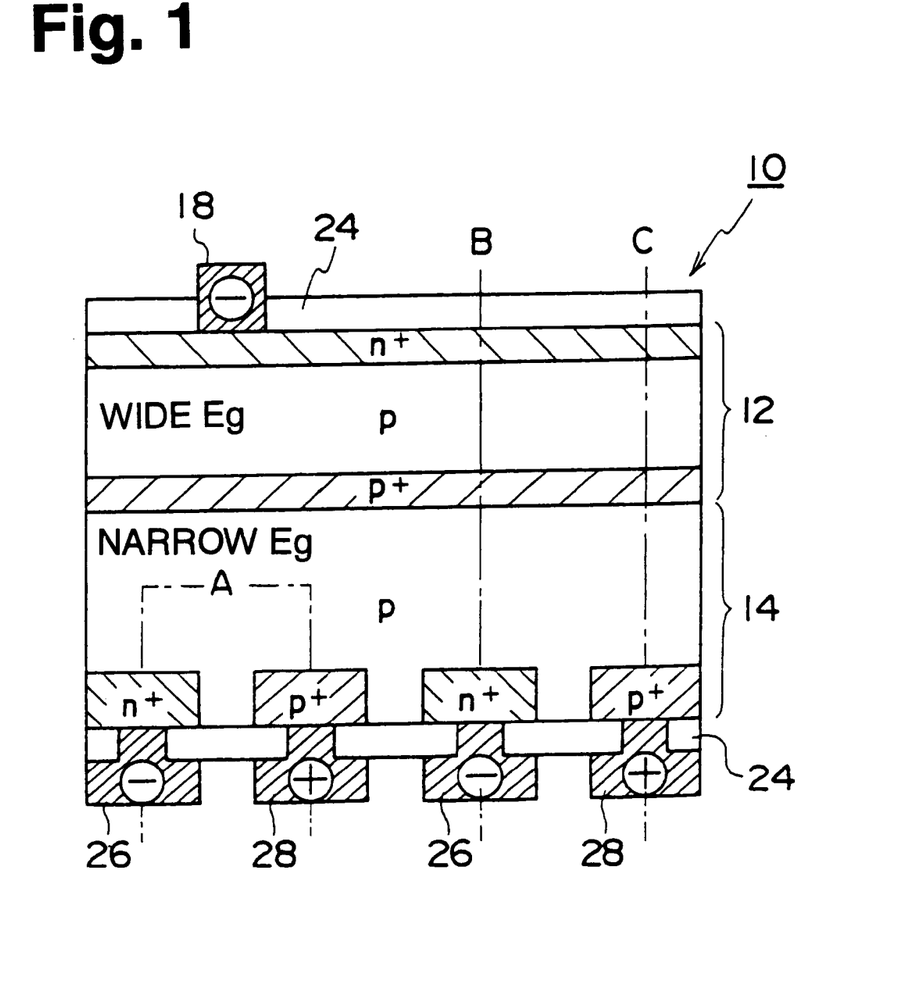
FIG. 1 is a cross sectional view showing a solar cell according to a first embodiment of the present invention.

FIG. 1 is a cross sectional view showing a structure of a solar cell according to the present invention. Referring to FIG. 1, a solar cell 10 has a tandem structure including stacked top and bottom cells 12 and 14. The top cell 12 is a unit solar cell formed of a semiconductor material with a wide band gap (Eg), while the bottom cell 14 is a unit solar cell formed of a semiconductor material with a narrow band gap.

The top cell 12 is formed by stacking an $n^+$ layer, a p layer, and a $p^+$ layer, functioning as a unit solar cell on the light incident side. A top electrode 18 is provided connecting to the uppermost $n^+$ layer. An insulating layer 24 provided on top of the $n^+$ layer is formed of a transparent material, and through this layer 24, sunlight is incident on the solar cell 10.

In the bottom cell 14, $n^+$ layers and $p^+$ layers are alternately provided at the back surface of the p layer serving as a substrate. A negative electrode 26 is individually connected to each $n^{30}$ layer, while a positive electrode 28 is individually connected to each $p^+$ layer, forming a back electrode of the present invention. The negative and positive electrodes 26 and 28 form a pair of electrodes of the bottom cell 14, and the positive electrode 28 is also used as an electrode forming a pair with the top electrode 18 which is one electrode of the top cell 12. It should be noted that the bottom cell 14 serves as a unit solar cell on the back side according to the present invention.

The above-described top cell 12 can be formed of, for example, AlGaAs having a band gap of 1.82 eV. In this case, the $n^+$ layer has a dopant concentration of $1 \times 10^{19}$ cm$^{-3}$ and a thickness of 0.1 μm, the p layer has a dopant concentration of $1 \times 10^{16}$ cm$^{-3}$ and a thickness of 1.0 μm, and the $p^+$ layer has a dopant concentration of $1 \times 10^{19}$ cm$^{-3}$ and a thickness of 0.1 μm.

One example of the material suitable for the bottom cell 14 is Si having a band gap of 1.11 eV. Using this material for the bottom cell 14, the $n^+$ layer has a dopant concentration of $1 \times 10^{19}$ cm$^{-3}$ and a thickness of 1.0 μm, the p layer has a dopant concentration of $5 \times 10^{13}$ cm$^{-3}$ and a thickness of 100 μm, and the $p^+$ layer has a dopant concentration of $1 \times 10^{19}$ cm$^{-3}$ and a thickness of 1.0 μm.

The top cell 12 can also be formed of InGaP or GaAs having a band gap of 1.88 eV and 1.42 eV, respectively. The bottom cell 14 can also be formed of GaAs with a band gap of 1.42 eV, or of Ge with a band gap of 0.66 eV.

Figure 2:
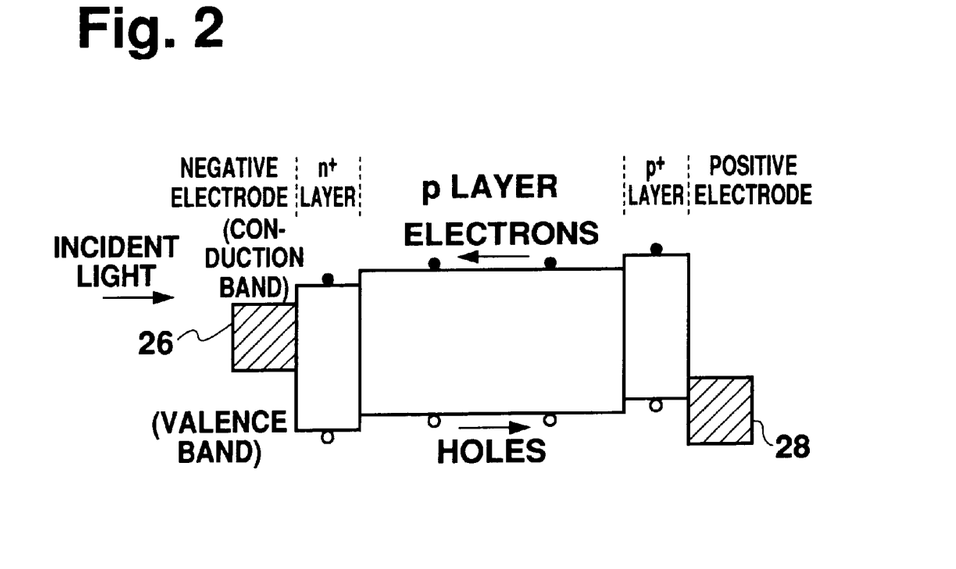
FIG. 2 shows a band structure of a portion indicated by line A in FIG. 1.
Figure 3:
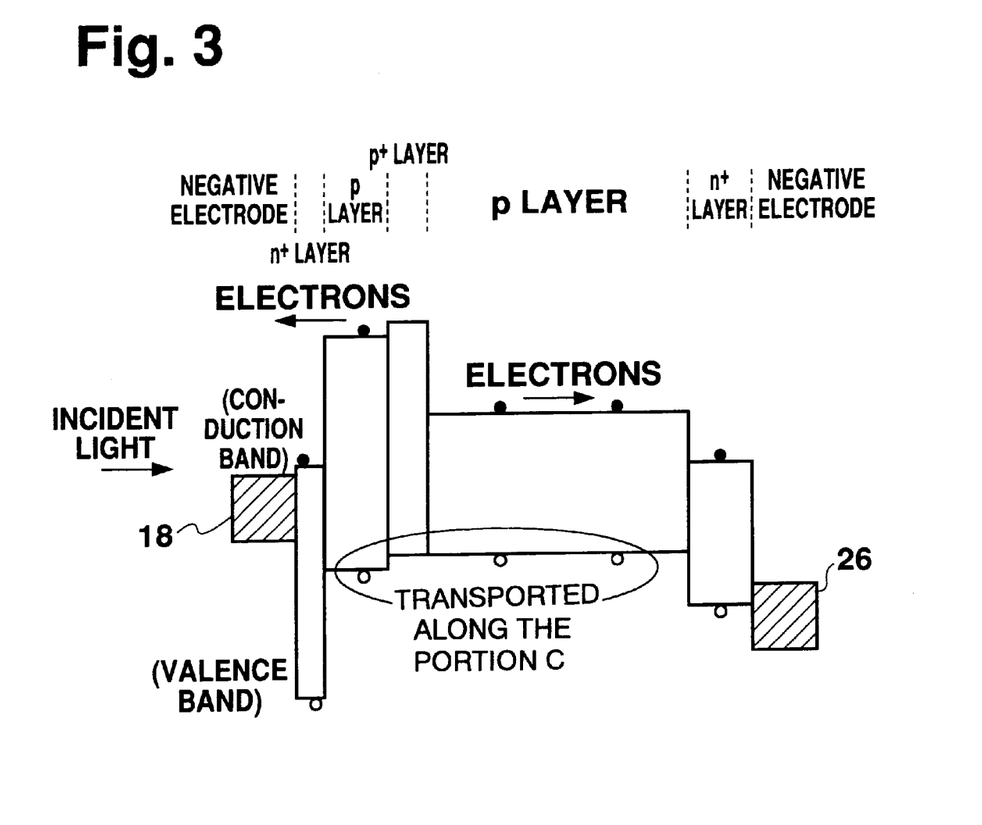
FIG. 3 shows a band structure of a portion indicated by line B in FIG. 1.
Figure 4:
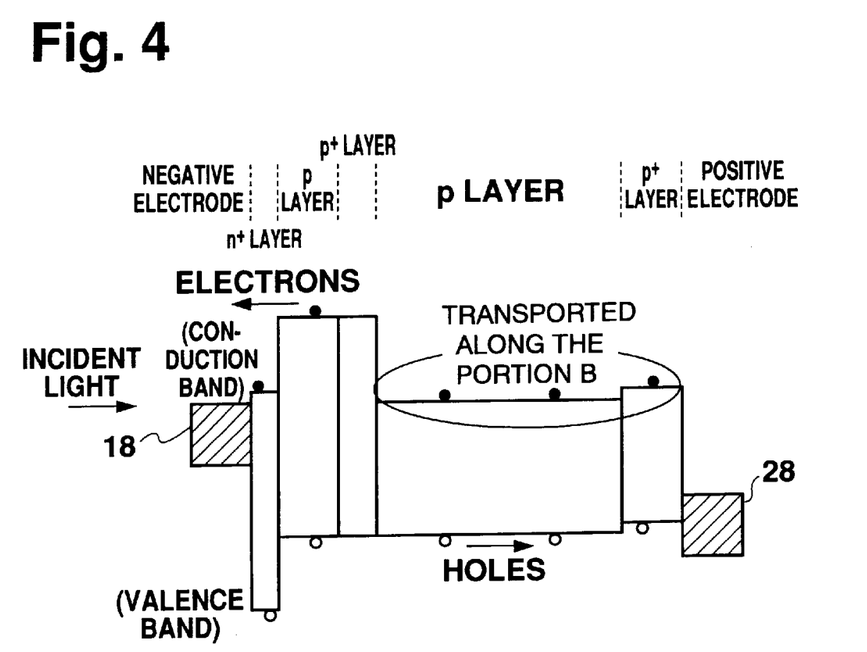
FIG. 4 shows a band structure of a portion indicated by line C in FIG. 1.

FIGS. 2–4 show band structures of the portions indicated by respective broken lines A, B, and C in FIG. 1. All these figures show the band structure at the time when the solar cell 10 is irradiated with light.

With the band structure shown in FIG. 2, i.e. the structure of the portion indicated by the broken line A in FIG. 1, electrons and holes, i.e. carriers, are generated in the bottom cell 14 when the solar cell 10 receives solar radiation. The electrons are transported to the $n^+$ layer and collected in the negative electrode 26 of the back electrode, while the holes are transported to the $p^+$ layer and collected in the positive electrode 28 of the back electrode. Since the generated carriers are transported only within the bottom cell 14, it is not necessary to match the amounts of currents flowing through the top and bottom cells 12 and 14, as in the conventional devices. In addition, no tunnel diode is required, and therefore carrier recombination loss can be avoided.

As shown in FIG. 3, at the portion indicated by the broken line B in FIG. 1, the conduction band of the $p^+$ layer, the lowermost layer of the top cell 12, has the highest energy level. Thus, the electrons generated in the top cell 12 when the solar cell 10 is irradiated with incoming sunlight are transported toward the top electrode 18, while the electrons generated in the bottom cell 14 are transported toward the negative electrode 26 of the back electrode.

At the portion B, the valence bands of the $n^+$ layers, which are the uppermost and lowermost layers of the solar cell 10, have lower energy levels. As a result, holes cannot be transported along the portion B. The holes generated in the top and bottom cells 12 and 14 travel horizontally, when viewed as FIG. 1, in the respective cells, and then are transported along the portion C.

Referring to FIG. 4, the valence bands have the same energy levels in the portion indicated by the broken line C in FIG. 1. This is because the dopant concentrations of the p layer and $p^+$ layer in the top cell 12 and of the p layer in the bottom cell 14 are appropriately adjusted so that the energy levels of the valence bands of these layers will be equal upon receiving solar radiation. In the portion shown in FIG. 4, i.e. the portion indicated by the broken line C in FIG. 1, the $n^+$ layer is formed on the light reception side of the solar cell 10, while the $p^+$ layer is formed on the back side. Such a structure allows the holes generated in the top and bottom cells 12 and 14 to be transported toward the $p^+$ layer on the back side and to be collected in the positive electrode 28, as shown in FIG. 4. Although the holes generated in the top cell 12 are transported through the interface between the top and bottom cells 12 and 14 in the course of the above-described transportation, no tunnel diodes are necessary because the energy levels are the same throughout the course of transportation.

In the portion C, the conduction bands of the p layer and the $p^+$ layer of the top cell 12 and of the $p^+$ layer of the bottom cell 14 have higher energy levels, whereby the electrons generated in the p layer of the bottom cell 14 cannot be transported along the portion C shown in FIG. 1. Therefore, the electrons generated therein are transported horizontally, when viewed as FIG. 1, in the bottom cell 14, and then are transported along the portion B. On the other hand, the electrons generated in the p layer and the $p^+$ layer of the top cell 12 are transported toward the $n^+$ layer of the top cell 12 before being collected in the top cell 18.

As described above, the negative and positive electrodes 26 and 28 provided at the back side of the bottom cell 14 function as a pair of electrodes of the bottom cell 14, and the positive electrode 28 is also used as the other electrode of the top cell 12, forming a pair with the top electrode 18 which is one electrode of the top cell 12. The above-described structure allows the electrons and holes generated in the bottom cell 14 to be collected in the negative electrode 26 and the positive electrode 28, respectively. The electrons generated in the top cell 12 are transported along the portion B to the $n^+$ layer of the top cell 12, and are collected in the top electrode 18. The holes generated in the top and bottom cells 12 and 14 travel along the portion C to the $p^+$ layer of the bottom cell 14, and are collected in the positive electrode 28. Thus, the solar cell 10 according to the present embodiment includes two stacked unit solar cells, i.e. the top cell 12 and the bottom cell 14. The two cells, however, are not connected in series as in the conventional device, and therefore it is not necessary to match the amounts of currents in the top and bottom cells 12 and 14. As a result, it is possible to provide each of the cells with the thickness most advantageous for optical absorption efficiency, to thereby improve photoelectric conversion efficiency.

In addition, since the $n^+$ layers are provided at the top of the top cell 12 and the bottom of the bottom cell 14, the electrons generated in these cells are transpoted to the respective $n^+$ layers, and are collected in the top electrode 18 on the light incident side and the negative electrode 26 on the back side, respectively. As a result, the traveling distance of the minority carriers, i.e. electrons, can be reduced, to thereby decrease recombination loss.

Further, contrary to conventional serially-connected tandem solar cells, the carriers need not pass through the energy barrier, and therefore no tunnel diodes are necessary. Thus, the need for forming tunnel diodes is eliminated, and carrier recombination loss and resistance loss in the tunnel diode can be avoided.

While a p type substrate is used as the substrate for forming the solar cell in the present embodiment, an n type substrate can also be used. Although with an n type substrate the relations between the conduction band and the valence band and between electrons and holes will be contrary to those described above, a device with the same functions can be obtained.

Second Embodiment

Figure 5:
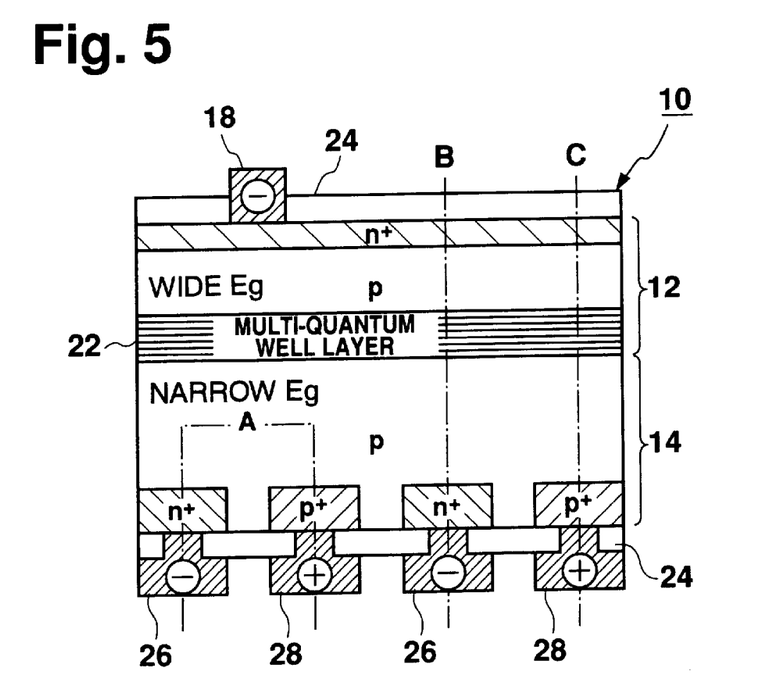
FIG. 5 is a cross sectional view showing a solar cell according to a second embodiment of the present invention.

FIG. 5 is a cross sectional view showing a second embodiment of the solar cell according to the present invention. Referring to FIG. 5, a multi-quantum well layer 22 formed by stacking two kinds of thin films with different band gaps is provided as the lowermost layer of the top cell 12. The multi-quantum well layer 22 is used as a means for utilizing optical excitation therein to improve photoelectric conversion efficiency in the solar cell. It should be noted that the layer 22 is formed between the top and bottom cells 12 and 14 in the present embodiment, while conventionally such a multi-quantum well layer has been formed between the p-n junction. This structure aims to eliminate any need for the carriers generated in the solar cell 10, especially the minority carriers, to pass through the multi-quantum well layer 22, to thereby prevent loss due to recombination of the minority carriers in the layer 22. The structure of the solar cell according to this embodiment is identical to that of the first embodiment shown in FIG. 1, except that the multi-quantum well layer 22 is provided between the top and bottom cells 12 and 14.

An example of the material which has a wide band gap and can be used for the multi-quantum well layer 22 is AlGaAs having a band gap (Eg) of 1.82 eV. When this material is used, the dopant concentration is $1 \times 10^{16}$ cm$^{-3}$, and the thickness is 20 nm. Meanwhile, as a material with a narrow band gap, GaAs can be used having a band gap of 1.42 eV. In this case, the dopant concentration is $1 \times 10^{16}$ cm$^{-3}$, and the thickness is 10 nm.

As another material with a wide band gap, GaAs with a band gap of 1.42 eV can also be used. With this material, the dopant concentration is $1 \times 10^{16}$ cm$^{-3}$, and the thickness is 30 nm. Also, InGaAs having a band gap of 1.25 eV can also be used as a material with a narrow band gap. In this case, the dopant concentration is $1 \times 10^{16}$ cm$^{-3}$, and the thickness is 15 nm.

Figure 6:
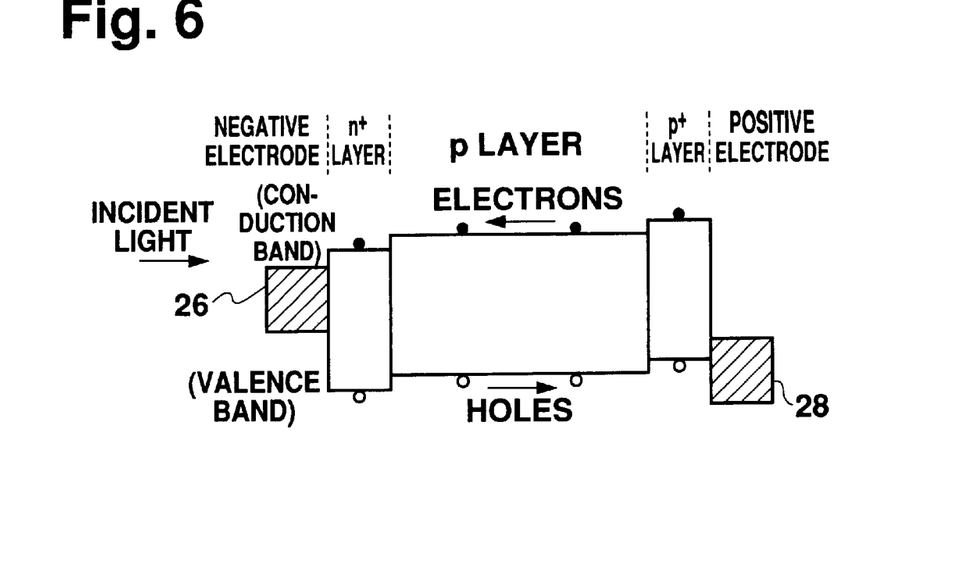
FIG. 6 shows a band structure of a portion indicated by line A in FIG. 5.
Figure 7:
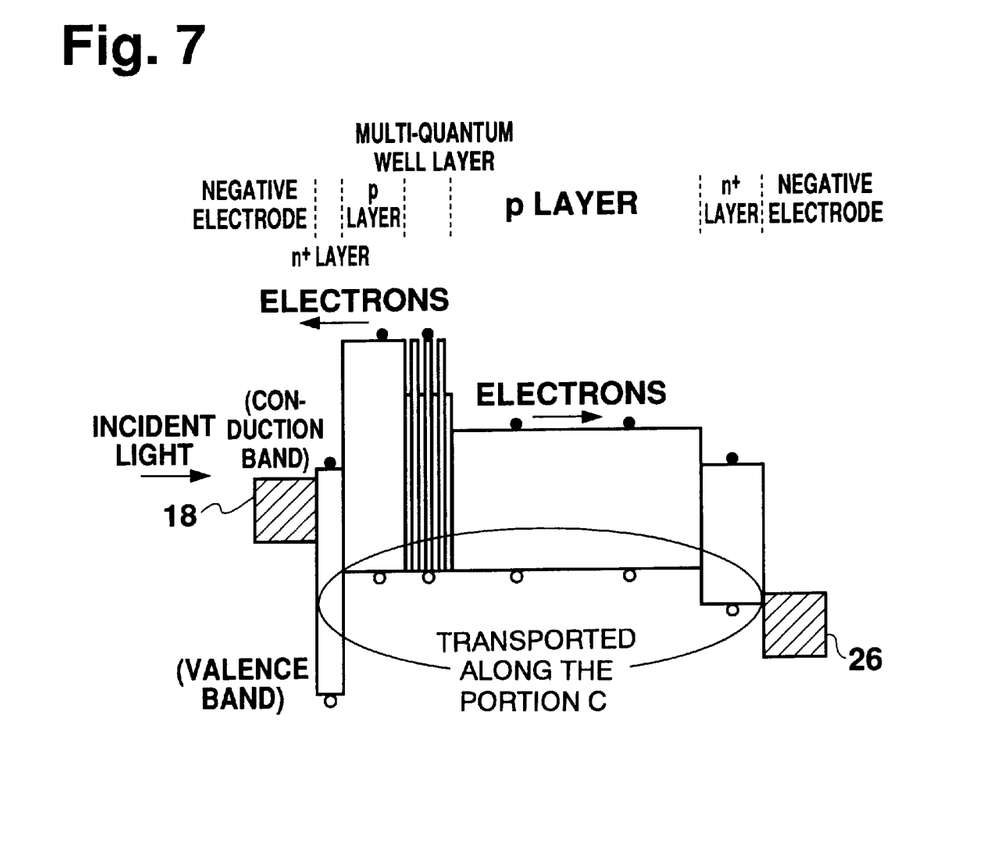
FIG. 7 shows a band structure of a portion indicated by line B in FIG. 5.
Figure 8:
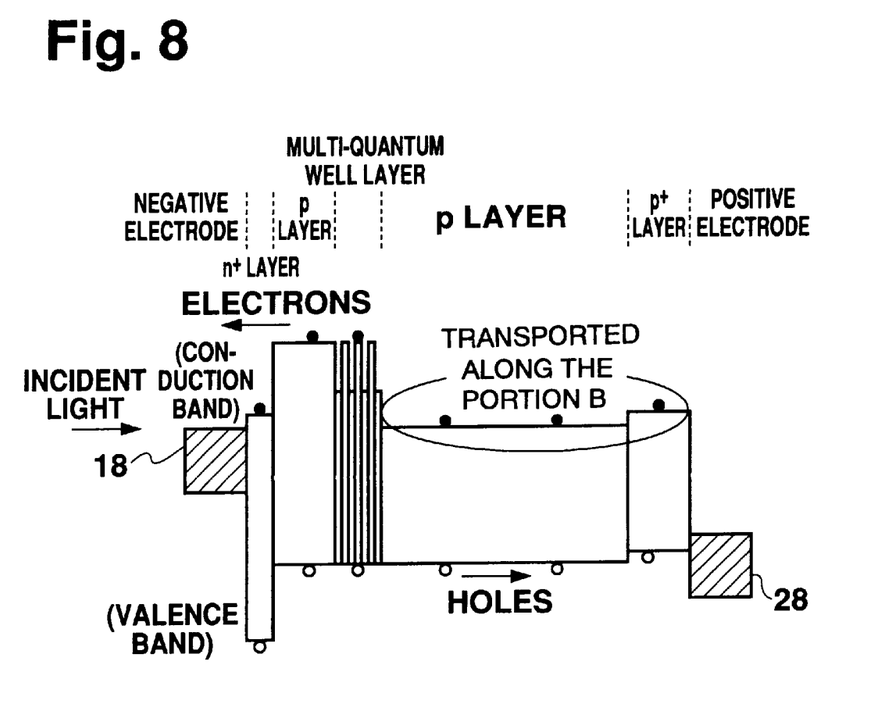
FIG. 8 shows a band structure of a portion indicated by line C in FIG. 5.

FIGS. 6–8 show band structures of the portions indicated by broken lines A, B, and C in FIG. 5, respectively. All these structures are related to those obtained when sunlight is incident on the solar cell 10.

The band structure in FIG. 6 of the portion A shown in FIG. 5 is the same as that of the first embodiment shown in FIG. 2. Therefore, the electrons generated in the bottom cell 14 are transported to the $n^+$ layer, and are then collected in the positive electrode 26. Meanwhile, holes travel to the $p^+$ layer and are collected in the positive electrode 28.

Referring to FIG. 7, the conduction bands of the p layer and the multi-quantum well layer 22 of the top cell 12 have the highest energy levels at the portion indicated by the broken line B shown in FIG. 5. Consequently, the electrons generated in the p layer and the multi-quantum well layer 22 of the top cell 12 are transported to the $n^+$ layer of the top cell 12, and are then collected in the top electrode 18. The electrons generated in the bottom cell 14 are transported to the $n^+$ layer provided on the back side of the bottom cell 14 because the energy barrier at the multi-quantum well layer 22 is high, and are then collected in the negative electrode 26 of the back electrode. Thus, according to this embodiment as well, $n^+$ layers are formed at the surface on the light incident side and the back surface of the solar cell 10, and the electrons generated in the top and bottom cells 12 and 14 are transported to the $n^+$ layers on the light incident side and the back side, respectively. As a result, the minority carriers, i.e. electrons, need not be transported through the multi-quantum well layer 22 which would otherwise cause a great carrier recombination loss. In addition, the traveling distance of electrons can also be reduced, to thereby improve power generation efficiency of the solar cell 10.

Meanwhile, in the portion B, the energy levels of the valence bands of the $n^+$ layers on the opposing sides of the solar cell 10 are lower, and those of the p layers and the multi-quantum well layer 22 provided therebetween are higher, as shown in FIG. 7. Consequently, the holes generated in the top and bottom cells 12 and 14 cannot be transported along the portion indicated by the broken line B in FIG. 5, but are transported horizontally, when viewed as FIG. 5, in the respective cells, and then along the portion C.

Referring to FIG. 8, the valence bands of the p layer and the multi-quantum well layer 22 in the top cell 12 and the p layer in the bottom cell 14 have the same energy level in the portion C indicated by the broken line in FIG. 5. As described earlier in conjunction with FIG. 4, this can be achieved by appropriately adjusting the dopant concentrations of the respective layers. As a result, the holes generated in the top cell 12, the multi-quantum well layer 22, and the bottom cell 14 travel to the $p^+$ layer formed on the back side of the bottom cell 14, and are then collected in the positive electrode 28. Although the holes generated in the top cell 12 pass through the multi-quantum well layer 22, this does not cause any problems because the multi-quantum well layer 22 of the present embodiment is formed of a p layer and recombination loss of the majority carriers (holes) is small.

In the portion C, the conduction bands of the p layer and the multi-quantum well layer 22 of the top cell, and of the $p^+$ layer of the bottom cell 14 have higher energy levels. Therefore, the electrons generated in the bottom cell 14 cannot be transported toward the $n^+$ layer formed in the top cell 12. Thus, the electrons generated in the bottom cell 14 are transported horizontally, when viewed as FIG. 5, and along the portion B to the $n^+$ layer of the bottom cell 14, and are eventually collected in the negative electrode 26. The electrons generated in the top cell 12 travel toward the $n^+$ layer provided in the top cell 12, and are then collected in the top electrode 18.

As described above, also in the present embodiment, the minority carrier electrons generated in the top and bottom cells 12 and 14 need not pass through the multi-quantum well layer 22 which would otherwise cause a great recombination loss, thereby avoiding decrease in electrons due to recombination loss, and achieving improvement in power generation efficiency. While the holes generated in the top cell 12 pass through the multi-quantum well layer 22 as described above, holes are the majority carriers in this embodiment and the energy level difference between the valence bands is small, and therefore recombination loss is suppressed to a small value. Thus, loss of carriers due to recombination is small and photoelectric conversion efficiency can be improved by effects of the multi-quantum well layer 22, whereby power generation efficiency of the solar cell 10 can further be enhanced according to the present embodiment.

While a p-type substrate is used as a substrate for forming a solar cell in this embodiment as well, an n-type substrate can also be used. With an n-type substrate, the relations between the conduction band and the valence band and between electrons and holes are opposite to those described above, but solar cells with the same function can be implemented.

Third Embodiment

Figure 9:
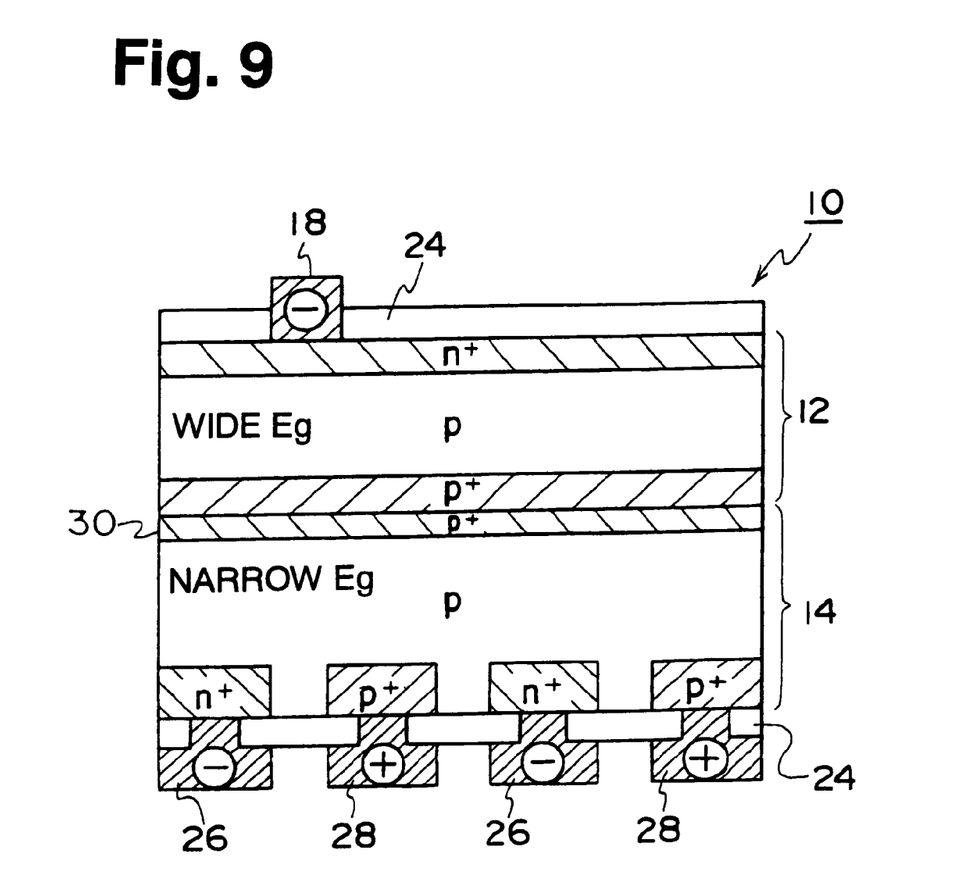
FIG. 9 is a cross sectional view showing an example where a diffusion layer is added to the solar cell shown in FIG. 1.

FIG. 9 is a cross sectional view showing a third embodiment of the solar dell according to the present invention. According to the first embodiment shown in FIG. 1 described above, there is a possible loss of the minority carrier electrons due to recombination at the interface between the top and bottom cells 12 and 14. According to this embodiment shown in FIG. 9, a diffusion layer 30 having a higher impurity concentration than the substrate of the bottom cell 14 is provided at the uppermost surface of the bottom cell 14, that is, the interface between the top and bottom cells 12 and 14.

Figure 10:
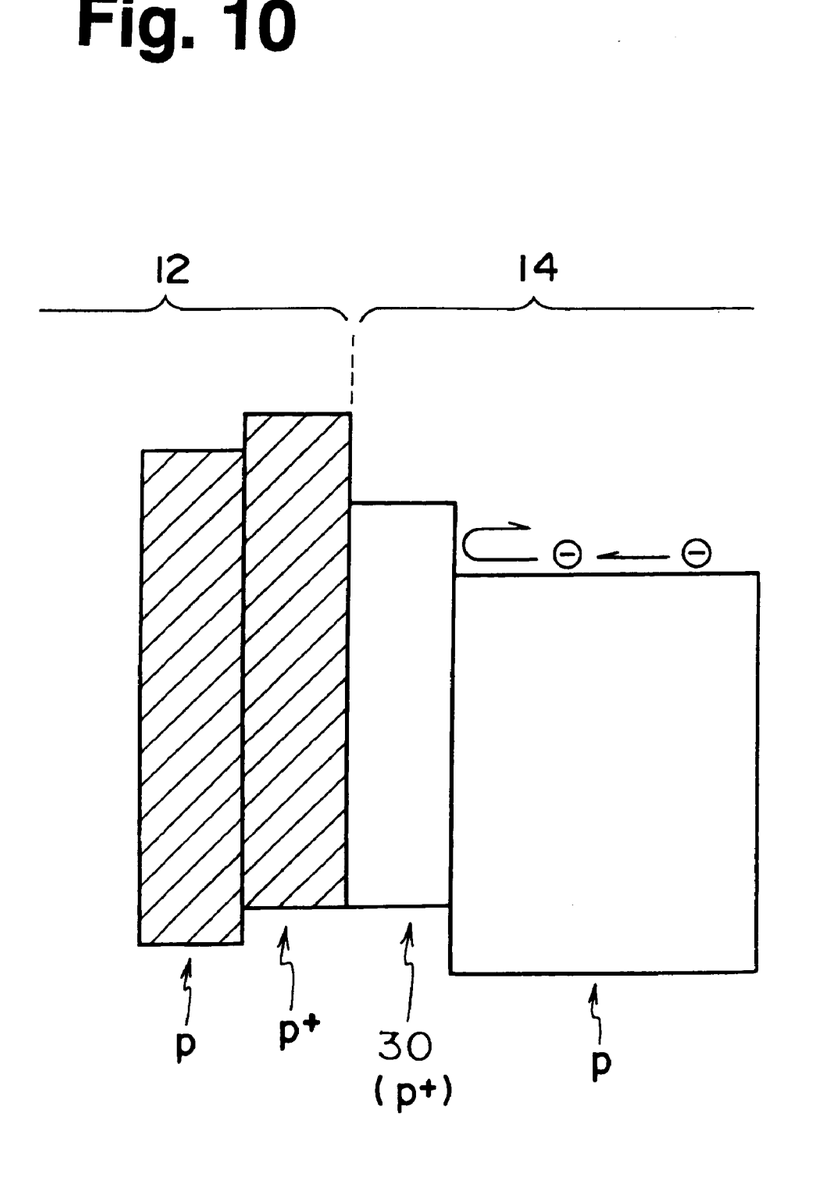
FIG. 10 shows a band structure of the area surrounding the diffusion layer shown in FIG. 10.

FIG. 10. illustrates a band structure of the portion surrounding the diffusion layer 30 shown in FIG. 9. Referring to FIG. 10, providing the diffusion layer 30 with a high impurity concentration creates a potential difference between the diffusion layer 30 and the p layer serving as a substrate of the bottom cell 14, resulting in a barrier. Consequently, this barrier can prevent the minority carrier electrons generated in the bottom cell 14 from moving toward the interface between the top and bottom cells 12 and 14. As a result, recombination loss of the minority carriers (electrons) at the interface between the top and bottom cells 12 and 14 can be suppressed, leading to a further improvement in photoelectric conversion efficiency.

Because the diffusion layer 30 has a higher impurity concentration than the substrate, there is a higher likelihood of carrier recombination in this layer. Therefore, the diffusion layer 30 preferably has a thickness of 5.0 $\mu$m or less, and more preferably, a thickness of 0.3–1.0 $\mu$m.

Figure 11:
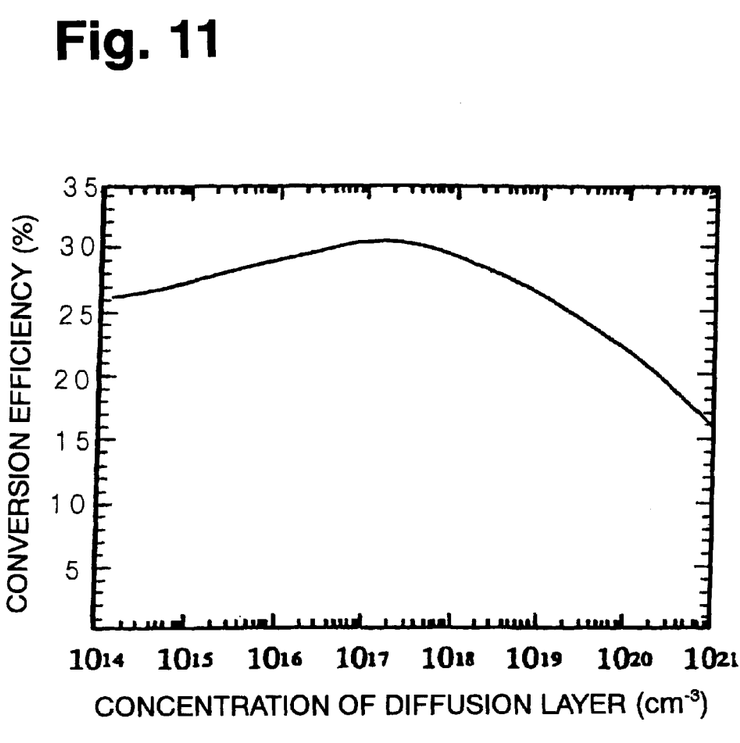
FIG. 11 shows relationship between impurity concentration of the diffusion layer and photoelectric conversion efficiency of the solar cell.

FIG. 11 shows a relation between the impurity concentration of the above-described diffusion layer 30 and photoelectric conversion efficiency of the solar cell 10. As apparent from FIG. 11, there exists a point where photoelectric conversion efficiency is highest against the impurity concentration of the diffusion layer 30. Thus, a certain optimum range exists for the impurity concentration of the diffusion layer 30. The impurity concentration of the diffusion layer 30 is preferably $10-10^6$ times, and more preferably $10^3-10^4$ times, as high as that of the p-type substrate of the bottom cell 14 described above. Carrier recombination in the diffusion layer 30 increases with the impurity concentration of the layer 30 exceeding $10^6$ times that of the substrate. On the other hand, if the impurity concentration of the diffusion layer 30 is less than 10 times the concentration of the substrate, the barrier shown in FIG. 10 becomes lower, and more minority carriers are transported beyond this barrier to reach the interface between the top and bottom cells 12 and 14. Thus, preferably the impurity concentration of the diffusion layer 30 is in a range of $10-10^6$ times as high as that of the substrate as described above.

While a p-type substrate is used again in this embodiment as a substrate for forming the solar cell, an n-type substrate can alternatively be used. Although in this case the relations between the conduction band and the valence band and between electrons and holes are opposite to the above-described relations, functionally the same solar cell can be implemented.

Fourth Embodiment

Figure 12:
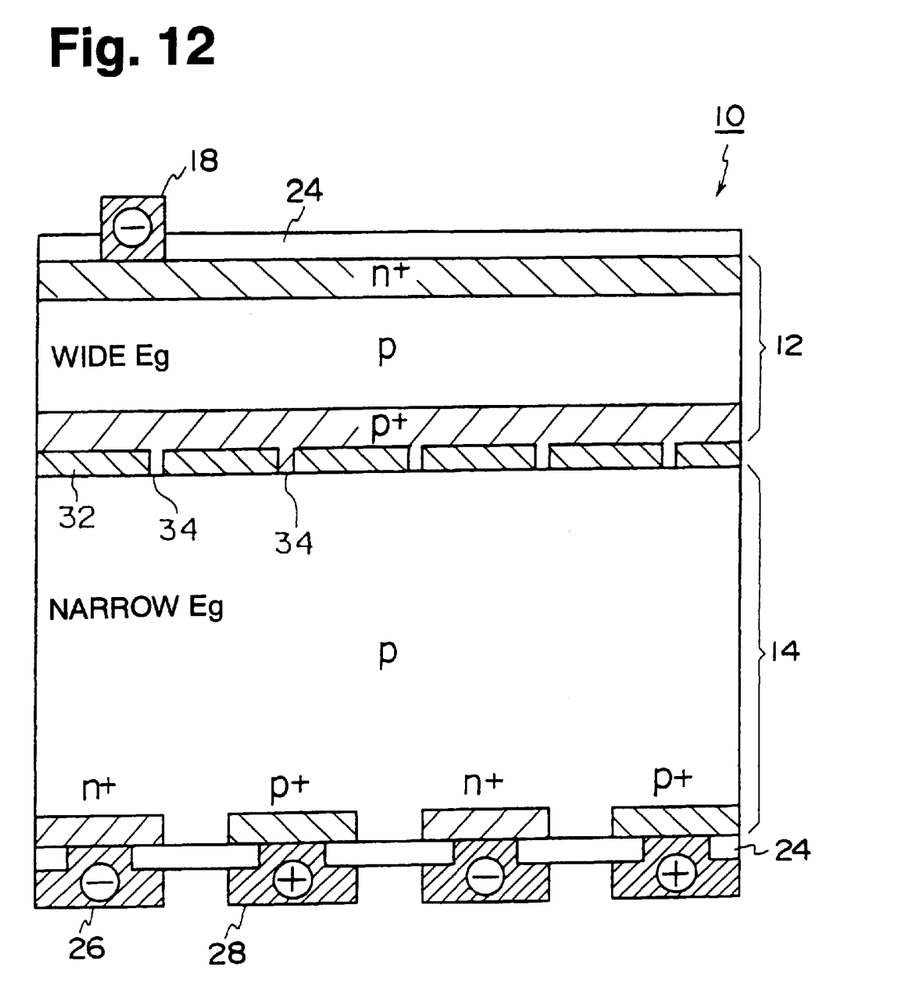
FIG. 12 is a cross sectional view showing a structure of a solar cell according to a fourth embodiment of the present invention.

FIG. 12 is a cross sectional view showing a structure of the solar cell according to a fourth embodiment of the present invention. Referring to FIG. 12, the solar cell 10 has a tandem structure including the stacked top and bottom cells 12 and 14. The top cell 12 is a unit solar cell formed of a semiconductor material with a wide band gap (Eg), while the bottom cell 14 is a unit solar cell formed of a semiconductor material with a narrow band gap.

An $n^+$ layer, a p layer, and a $p^+$ layer are stacked to form the top cell 12, serving as a unit solar cell on the light incident side according to the present invention. The top electrode 18 is disposed connected to the uppermost $n^+$ layer. The insulating film 24 formed of a transparent material is provided on top of the $n^+$ layer. Through this insulating film 24, sunlight is incident on the solar cell 10.

In the bottom cell 14, $n^+$ layers and $p^+$ layers are alternatively formed at the back surface of the p layer functioning as a substrate. The negative electrode 26 is individually connected to each $n^+$ layer, whereas the positive electrode 28 is individually connected to each $p^+$ layer, forming a back electrode of the present invention. These negative and positive electrodes 26 and 28 form a pair of electrodes for the bottom cell 14, and the positive electrode 28 is also used as the electrode forming a pair with the top electrode 18 that is one electrode of the top cell 12. The bottom cell 14 corresponds to a unit solar cell on the back side according to the present invention.

The above-described top cell 12 can be formed of, for example, AlGaAs, having a band gap of 1.82 eV. If this material is used, the $n^+$ layer has a dopant concentration of $1\times10^{19}$ $cm^{-3}$ and a thickness of 0.1 $\mu$m, the p layer has a dopant concentration of $1\times10^{16}$ $cm^{-3}$ and a thickness of 1.0 $\mu$m, and the $p^+$ layer has a dopant concentration of $1\times10^{19}$ $cm^{-3}$ and a thickness of 0.1 $\mu$m.

An example of the material for the bottom cell 14 is Si, having a band gap of 1.11 eV. In this case, the $n^+$ layer has a dopant concentration of $1\times10^{19}$ $cm^{-3}$ and a thickness of 1.0 $\mu$m, the p layer has a dopant concentration of $5\times10^{13}$ $cm^{-3}$ and a thickness of 100 $\mu$m, and the $p^+$ layer has a dopant concentration of $1\times10^{19}$ $cm^{-3}$ and a thickness of 1.0 $\mu$m.

Alternatively, GaAs with a band gap of 1.42 eV can be used to form the top cell 12, whereas Ge with a band gap of 0.66 eV can also be used to form the bottom cell 14.

The present embodiment is characterized in that an insulating layer 32 is provided at the uppermost surface of the bottom cell 14. By thus forming the insulating layer 32, an unbonded valence electron present at the upper surface of the bottom cell 14 is bonded with oxygen or nitrogen forming the insulating layer 32, to thereby eliminate lattice defects. Consequently, recombination loss of the minority carriers caused by defects at the interface between the top and bottom cells 12 and 14 can be reduced.

The insulating film 32 can be formed of materials such as $SiO_2$, SiNx, and SiC, and preferably its thickness is in the range of 1–5000 nm, and more preferably in the range of 50–500 nm.

However, if only the insulating layer 32 is provided between the top and bottom cells 12 and 14, the carriers (holes) generated in the top cell 12 cannot be driven up to the positive electrode 28 provided at the back side of the bottom cell 14, resulting in a decrease of power generation efficiency. Therefore, an opening 34 is provided at a prescribed area ratio. The ratio of the area of the opening 34 to the overall surface area of the uppermost surface of the bottom cell 14 is 0.01–10%, and preferably 0.1–2%. Although a wider area of the opening 34 leads to a better movement of the carrier holes generated in the top cell 12 and further to reduction in resistance loss, recombination loss at the opening 34 is increased. For this reason, the above area ratio is preferable.

Figure 13A:
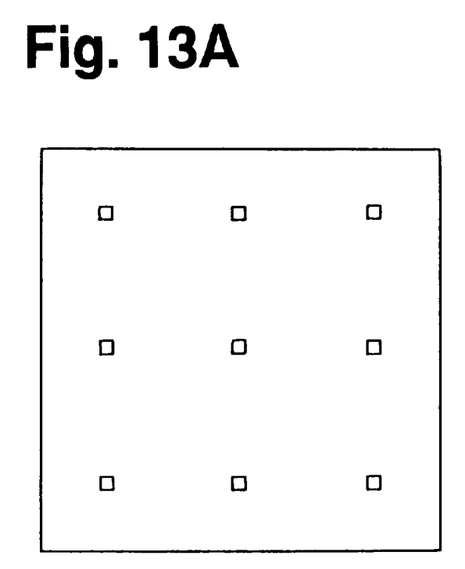
FIG. 13A shows a layout example of the opening shown in FIG. 12.
Figure 13B:
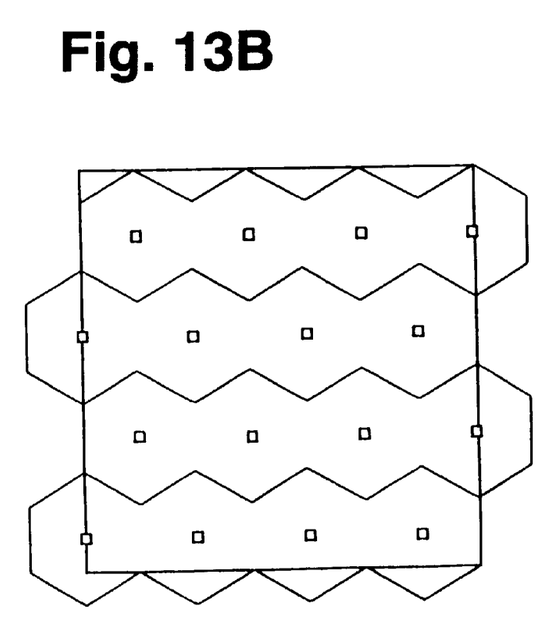
FIG. 13B shows a layout example of the opening shown in FIG. 12.

FIGS. 13A and 13B illustrate exemplary arrangement of the openings 34 provided in the insulating layer 32, in which the openings 34 are arranged in squares and hexagons, respectively. Arrangement patterns of the openings 34 other than these examples are also possible as long as they are substantially uniformly distributed at the upper surface of the bottom cell 14.

Formation of the solar cell 10 according to the present embodiment begins with formation of the bottom cell 14, followed by provision of the insulating layer 32 on the uppermost surface thereof, and of the top cell 12. In this embodiment, the $p^+$ layer of the top cell 12 formed on the insulating layer 32 has a larger grain size because the seed crystal portion thereof is limited to the opening 34, to thereby decrease crystal interface area and reduce carrier recombination loss at the interface.

If the impurity concentration of the $p^+$ layer in the opening 34 is further raised (to be a $p^{++}$ layer), movement of the carriers generated in the top cell 12 is facilitated, to thereby further reduce resistance loss.

As described above, the solar cell 10 of the present embodiment makes it possible to decrease lattice defects at the uppermost surface of the bottom cell 14 by forming the insulating layer 32, reduce carrier recombination loss, and diminish resistance loss by providing the openings 34 in the insulating layer 32. As a result, a solar cell with a high power generation efficiency can be implemented.

Fifth Embodiment

Figure 14:
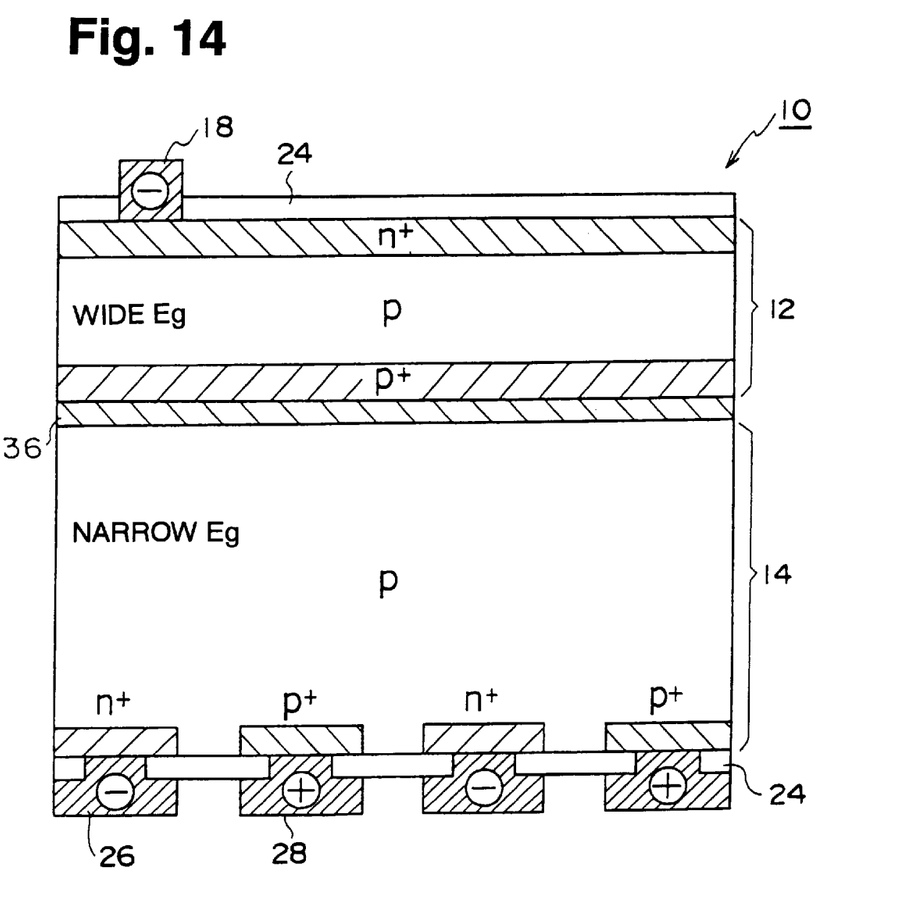
FIG. 14 is a cross sectional view showing a structure of a solar cell according to a fifth embodiment of the present invention.

FIG. 14 is a cross sectional view showing a structure of the solar cell according to a fifth embodiment of the present invention. The elements identical to those in FIG. 12 are labeled with the same numerals in this figure, and will not be described again.

Referring to FIG. 14, the solar cell 10 according to the present embodiment includes an intermediate layer 36 containing hydrogen or halogen between the top and bottom cells 12 and 14. According to this embodiment, the intermediate layer 36 containing hydrogen or the like is formed on the uppermost surface of the bottom cell 14, followed by formation of the top cell 12 and heat treatment in reduction atmosphere, etc. As a result, elements such as hydrogen or halogen are diffused at the interface between the top and bottom cells 12 and 14, and bonded to unbonded valence electrons existing therein, to thereby reduce lattice defects at the interface, so that carrier recombination loss at the interface is decreased. Consequently, the amount of power generated in the tandem solar cell can be increased, and photoelectric conversion efficiency can be improved.

The above intermediate layer 36 preferably has a thickness of, for example, 1–1000 nm. A greater thickness causes increase in resistance loss, and a smaller thickness weakens the effects given by the intermediate layer 36.

The concentration of hydrogen, halogen, or the like contained in the intermediate layer 36 is preferably in the range of 1 ppm–30% by weight, based on the weight of the intermediate layer. An excessively high concentration incurs a greater resistance loss, and the effects of the layer 36 cannot be fully exerted with an excessively low concentration thereof. Hydrogen or halogen can be added to the intermediate layer 36 by methods such as ion implantation.

While the intermediate layer 36 is formed at the uppermost surface of the bottom cell 14 in this embodiment, it can also be formed at the lowermost surface of the top cell 12. Alternatively, the insulating layer 32 having openings 34 of the fourth embodiment can also be provided to contain hydrogen, halogen, or the like, which is then diffused at the interface between the top and bottom cells 12 and 14 by heat treatment or the like, to thereby reduce unbonded valence electrons.

INDUSTRIAL APPLICABILITY

As described above, according to the present invention, the minority carriers generated in each of the unit solar cells with different band gaps are transported only within the unit solar cell where they are generated, so that a significant reduction in recombination loss can be achieved. In addition, the respective unit solar cells are not connected in series, and therefore carriers can be obtained for each unit solar cell, to thereby eliminate any need for matching the amounts of currents flowing through the respective unit solar cells. As a result, each of the unit solar cells can have an optimum thickness for the highest photoelectric conversion efficiency, so that power generation efficiency can be further enhanced.

A further increase in photoelectric conversion efficiency can be obtained by forming a multi-quantum well layer between the respective unit solar cells.

The diffusion layer formed at the uppermost surface of the bottom cell suppresses recombination of carriers at the interface between the top and bottom cells.

The insulating layer contributes to reduction in lattice defects and the opening provided therein allows passage of carriers, whereby both recombination loss and resistance loss can be reduced simultaneously.

Since hydrogen or halogen is bonded to unbonded valence electrons, lattice defects can be decreased and recombination loss at the interface between the top and bottom cells can also be reduced.

What is claimed is:

1. A tandem solar cell, comprising:

a first unit solar cell stacked upon a second unit solar cell, wherein said first unit solar cell forms a light incident surface of the tandem solar cell, said second unit solar cell forms a back side of the tandem solar cell, and said first unit solar cell has a band gap different from a band gap of said second unit solar cell;

a top electrode provided at the light incident surface that serves as one electrode of said first unit solar cell; and back electrodes provided at the back side and individually connected to an n layer and a p layer formed on a lower portion of said second unit solar cell to serve both as another electrode of said first unit solar cell and as pairs of electrodes of said second unit solar cell.

2. The tandem solar cell according to claim 1, further comprising a multi-quantum well layer formed between said first unit solar cell and said second unit solar cell.

3. A tandem solar cell, comprising:

a first unit solar cell stacked upon a second unit solar cell, wherein said first unit solar cell forms a light incident surface of the tandem solar cell, said second unit solar cell forms a back side of the tandem solar cell, and said first unit solar cell has a band gap different from a band gap of said second unit solar cell;

a top electrode provided at the light incident surface that serves as one electrode of said first unit solar cell; and back electrodes provided at the back side and individually connected to an n layer and a p layer formed on a lower portion of said second unit solar cell to serve both as another electrode of said first unit solar cell and as pairs of electrodes of said second unit solar cell; wherein said second unit solar cell includes a diffusion layer formed on an uppermost surface of said second unit solar cell, said diffusion layer having a higher impurity concentration than a substrate of said second unit solar cell.

4. The solar cell according to claim 3, wherein the impurity concentration of said diffusion layer is $10$–$10^6$ times as high as that of the substrate.

5. A tandem solar cell, comprising:

a first unit solar cell stacked upon a second unit solar cell, wherein said first unit solar cell forms a light incident surface of the tandem solar cell, said second unit solar cell forms a back side of the tandem solar cell, and said first unit solar cell has a band gap different from a band gap of said second unit solar cell;

a top electrode provided at the light incident surface that serves as one electrode of said first unit solar cell; and back electrodes provided at the back side and individually connected to an n layer and a p layer formed on a lower portion of said second unit solar cell to serve both as another electrode of said first unit solar cell and as pairs of electrodes of said second unit solar cell; wherein said second unit solar cell includes an insulating layer provided at an uppermost surface of said second unit solar cell, said insulating layer including at least one opening.

6. The tandem solar cell according to claim 5, wherein a total area of said at least one opening is equal to 0.01–10% of an overall surface area of said uppermost surface of said second unit solar cell.

7. The tandem solar cell according to claim 5, wherein a total area of said at least one opening is equal to 0.01–2% of an overall surface area of said uppermost surface of said second unit solar cell.

8. A tandem solar cell, comprising:

a first unit solar cell stacked upon a second unit solar cell, wherein said first unit solar cell forms a light incident surface of the tandem solar cell, said second unit solar cell forms a back side of the tandem solar cell, and said first unit solar cell has a band gap different from a band gap of said second unit solar cell;

a top electrode provided at the light incident surface that serves as one electrode of said first unit solar cell;

back electrodes provided at the back side and individually connected to an n layer and a p layer formed on a lower portion of said second unit solar cell to serve both as another electrode of said first unit solar cell and as pairs of electrodes of said second unit solar cell; and an intermediate layer containing hydrogen or halogen provided between the first unit solar cell and the second unit solar cell.

9. The tandem solar cell according to claim 8, wherein the concentration of said hydrogen or halogen is 1 ppm–30% by weight of said intermediate layer.

* * * * *